United States Patent [19]

Dierke

[11] Patent Number: 5,574,692
[45] Date of Patent: Nov. 12, 1996

[54] MEMORY TESTING APPARATUS FOR MICROELECTRONIC INTEGRATED CIRCUIT

[75] Inventor: Gregg Dierke, San Jose, Calif.

[73] Assignee: LSI Logic Corporation, Milpitas, Calif.

[21] Appl. No.: 472,857

[22] Filed: Jun. 7, 1995

[51] Int. Cl.$^6$ ................................................. G11C 29/00
[52] U.S. Cl. ...................................... 365/201; 365/189.02
[58] Field of Search ................................... 365/201, 200, 365/230.03, 220, 189.02

[56] References Cited

U.S. PATENT DOCUMENTS

| | | | |
|---|---|---|---|
| 3,961,251 | 6/1976 | Hurley et al. | 324/73 |
| 4,357,703 | 11/1982 | Van Brunt | 371/15 |
| 5,202,853 | 4/1993 | Choi | 365/201 |
| 5,265,100 | 11/1993 | McClure et al. | 365/201 |
| 5,331,596 | 7/1994 | Miyazawa et al. | 365/201 |
| 5,377,144 | 12/1994 | Brown | 365/201 |
| 5,416,741 | 5/1995 | Ohsawa | 365/201 |
| 5,436,910 | 7/1995 | Takeshima | 365/201 |
| 5,475,815 | 12/1995 | Byers et al. | 365/201 |

Primary Examiner—Tan T. Nguyen
Attorney, Agent, or Firm—Poms, Smith, Lande & Rose

[57] ABSTRACT

A testing apparatus is integrally formed on a microelectronic integrated circuit chip for testing a plurality of memories including parallel outputs having a total of a first number of bits. The apparatus includes an input unit for writing test data into the memories, a parallel output bus having a second number of bits which is smaller than the first number of bits, and an output unit for selectively connecting outputs of the memories to the output bus such that a total number of bits of the selected outputs is not greater than the second number of bits. The outputs of the memories are connected to the output unit in groups, and the output unit is configured to selectively connect the groups of outputs to the output bus in response to respective control signals to read test data out of the memories. Data is applied from the memories to the output unit in bytes. For memories that have parallel outputs wider than one byte of data, multiplexers are provided for successively applying the data from the memories to the output unit one byte at a time. Output data is true data, not encrypted to reduce bits and, thusly, observability.

18 Claims, 5 Drawing Sheets

MEMORY TESTING APPARATUS FOR MICROELECTRONIC INTEGRATED CIRCUIT

BACKGROUND OF THE INVENTION

1. Field of the Invention

The present invention generally relates to the art of microelectronic integrated circuits, and more specifically to a memory testing apparatus which is formed as an integral part of an integrated circuit chip.

2. Description of the Related Art

The increased size and complexity of modern microelectronic integrated circuit chip design not only allows, but requires that more memory be moved on-chip.

This presents a difficult problem. The high-density nature of current RAM and ROM designs makes on-chip memories more susceptible to process and manufacturing flaws. They also tend to have much lower fault coverage than other logic during a given test program.

Even sophisticated Automatic Test Program Generator (ATPG) such as Sunrise, etc., which take advantage of a memory to test the logic in its shadow, do not actually generate vectors to test the memories themselves. Testing a memory in its shadow involves applying test data to memories through the logical circuitry of the chip. If the test results indicate a malfunction, it cannot be determined if the malfunction is in the logic circuitry or in the memory.

Functional test vectors extracted from a reference model performing some real-world operation constitute a good starting point. However, from the memory's perspective, the test is random, haphazard, and with poor controllability and observability. The advantage of functional and ATPG vectors is that it requires little effort on the part of Design Engineering and absolutely no hardware.

Specialized test vectors generated by sophisticated ATPG can easily increase fault coverage for an entire chip to the 95% level, with added scan registers.

However, these fault coverage numbers do not include the on-chip memories at all. Even though such tools may take advantage of a memory to test circuitry in its shadow, they do not actually target the memories at all.

There is more to testing a RAM than simply writing and reading each location. Specific patterns like "walking one's", "walking zero's", and "checkerboard" are required for thorough testing.

Built-In Self Test (BIST) circuitry automatically generates such patterns, and provides an output indicating whether the memory failed or passed the generated tests. The advantage over test vectors is that with BIST, the memories can be tested at any time in the field, and so offer some degree of continued fault detection.

However, the overhead is high, as BIST circuits tend to be quite large compared to the memory they test, especially for small memories. Also, the single Pass/Fail output does not provide desired information about the problem that Test Engineering might require.

There exists in the art a need for a memory testing apparatus which requires no extra pins, allows any memory to be written and read in any way desired in the field as well as on the tester, uses little added hardware, can be integrated easily with the existing "no-test-H/W" design, and has little impact on routing.

SUMMARY OF THE INVENTION

A testing apparatus according to the present invention which fills the need identified above is integrally formed on a microelectronic integrated circuit chip for testing a plurality of memories including parallel outputs having a total of a first number of bits.

The apparatus includes an input unit for writing test data into the memories, a parallel output bus having a second number of bits which may be greater or smaller than the first number of bits, and an output unit for selectively connecting outputs of the memories to the output bus such that a total number of bits of the selected outputs is greater or smaller than the second number of bits.

The outputs of the memories are connected to the output unit in groups, and the output unit is configured to selectively connect the groups of outputs to the output bus in response to respective control signals to read test data out of the memories.

Data is applied from the memories to the output unit in bytes. For memories that have parallel outputs wider than one byte of data, multiplexers are provided for successively applying the data from the memories to the output unit one byte at a time.

Output data is true data, not encrypted to reduce bits and, thusly, observability.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
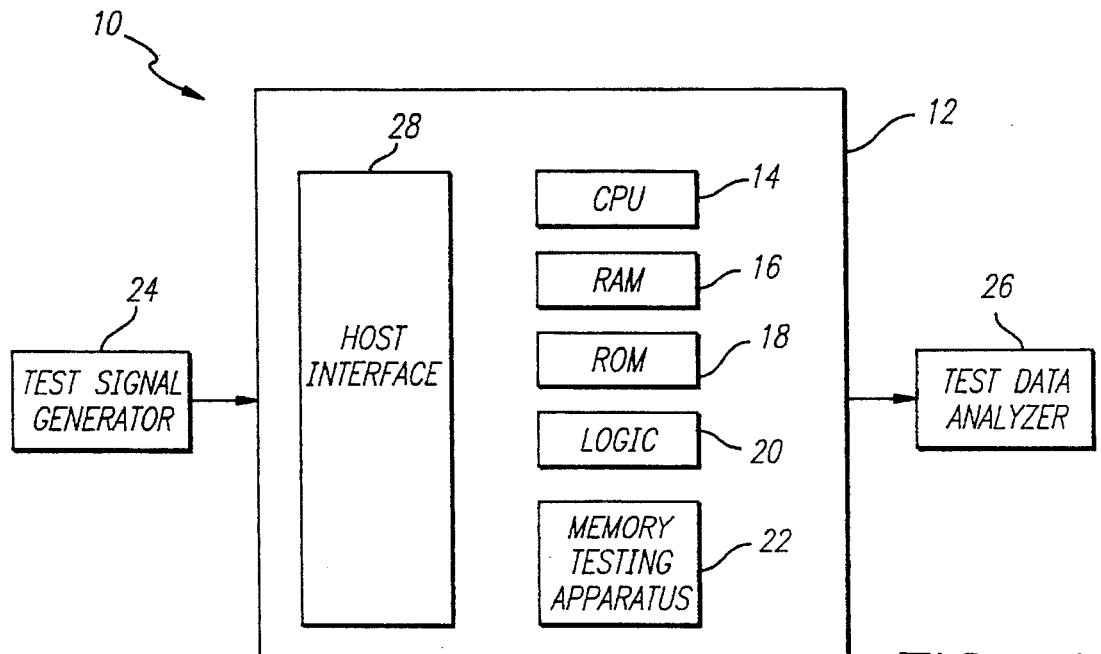
FIG. 1 is a block diagram illustrating a microelectronic integrated circuit including a memory testing apparatus embodying the present invention.

A microelectronic integrated circuit 10 comprising a memory testing apparatus embodying the present invention is illustrated in the form of a block diagram in FIG. 1. The integrated circuit 10 is formed on a semiconductor substrate 12 and may implement any desired logical functionality.

A preferred implementation of the present invention as will be described in detail below is in the L64112/L64000/L64002 series of MPEG Video chips which are products of LSI Logic Corporation of Milpitas, Calif., the assignee of the invention. However, the invention is not so limited, and can be adapted to any integrated circuit having a user-programmable interface.

In the exemplary embodiment of FIG. 1, the circuit 10 comprises a Central Processing Unit (CPU) 14, a plurality of Random Access Memories (RAM) 16, a plurality of Read Only Memories (ROM) 18, logical circuitry 20, and a memory testing apparatus 22 according to the present invention.

Further illustrated in FIG. 1 is a test signal generator 24 for applying input test data signals to the circuit 10, and a test data analyzer 26 for analyzing output test data signals which the circuit 10 produces in response to the input test delta signals.

Figure 2:
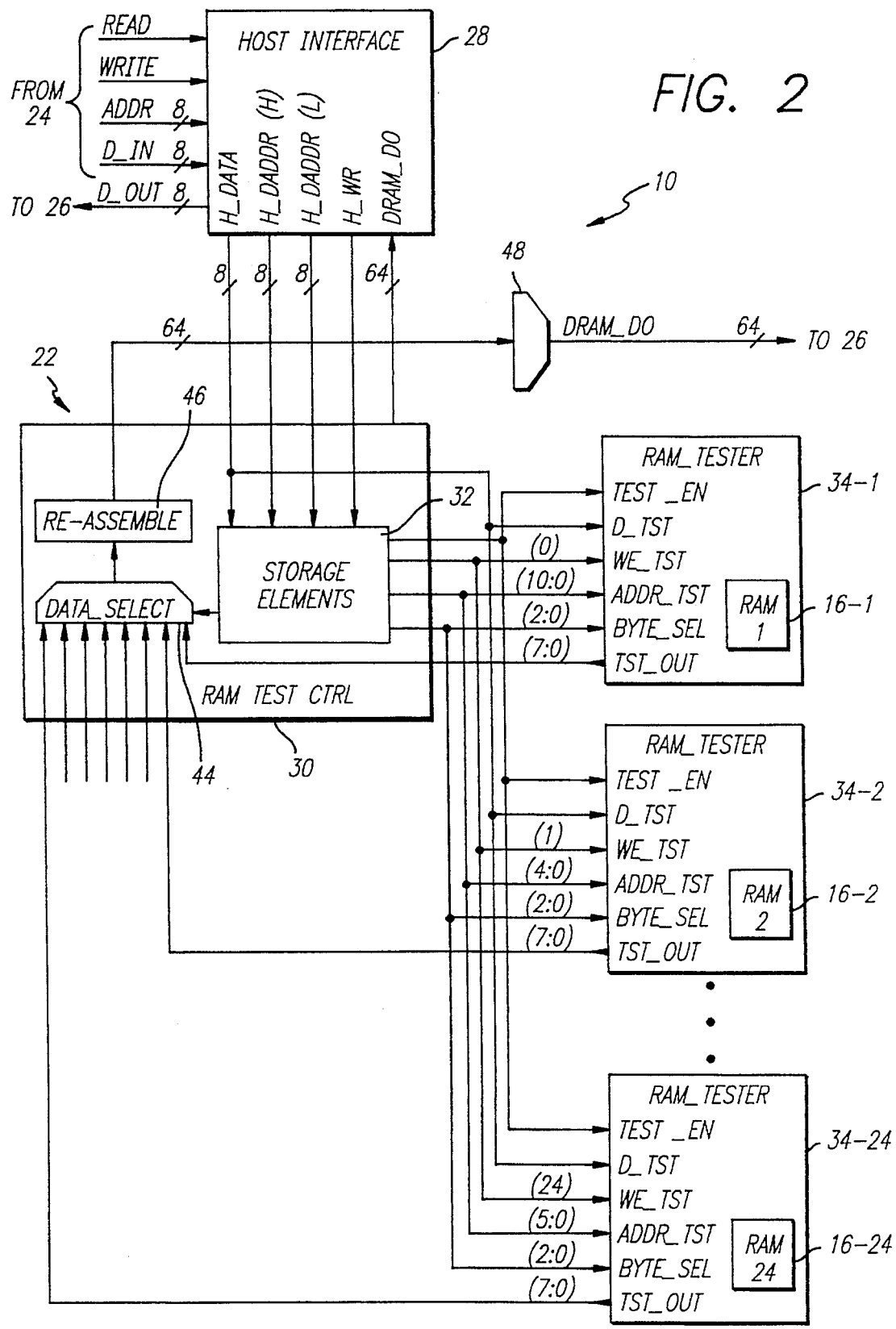
FIG. 2 is a schematic block diagram illustrating the present memory testing apparatus.

LSI Logic's MPEG Video Decoder chips, as well as many of LSI's other larger chips, employ a standard 14-pin host microcontroller interface designed to communicate with many off-the-shelf microcontrollers. This interface is illustrated in FIGS. 1 and 2 of the drawings and designated by the reference numeral 28. The interface 28 is primarily used for tasks including programming various internal registers, reading back status values, and writing/reading a DRAM connected to a decoder.

The testing apparatus 22 comprises a RAM test control unit 30 including storage elements 32 for performing the operations of reading and writing all the on-chip memories. The storage elements 32 are set up using the L64002 host interface 28. The addresses of the storage elements 32 are the same as the addresses of the storage elements (not shown) already existing in the L64002, so the storage elements 32 used for testing memories are written to whenever the storage elements which they shadow are written.

There is no read back through the host interface 28 of the storage elements 32 which are used just for on-chip memory testing. Since the storage elements 32 exist in the shadow of other on-chip storage, there would be a conflict in trying to read data from two locations with the same address.

During write operations, write-data will be provided to all memories on a buffered copy of the pins of the 8-bit host interface 28. This bus was selected to provide the data because it already goes to several modules. For memories that have data-in words wider than eight bits, this data is replicated for the additional bytes. These two features help minimize routing impact, while still offering enough flexibility to write substantially any test pattern desired.

Internal locations are written and read similarly to an external DRAM. The DRAM address auto-increment function is retained. From the users' perspective, reading/writing internal memory is identical to reading/writing external memory.

As will be described in detail below, the hardware required at the memory inputs includes two-to-one multiplexers at each input, selecting either a test or a functional signal. To read back the test data, a multiplexer is also provided at the memory outputs to decrease the number of test data outputs, and thus minimize routing impact.

The L64002 implementation uses a maximum of eight test outputs per memory, but this could be reduced to a single output with additional multiplexers, reducing routing impact even further. Read time, however, would increase significantly.

During test reads, the RAM address is provided by the storage elements 32 used specifically for the memory testing. The storage elements 32 can be loaded using the host interface 28, just as in the write operation, or the read address can be allowed to increment on every clock cycle. This method of controlling the read address is referred to as "auto-increment" mode during memory test reads and has been designed in order to allow a quicker method of reading on-chip memory than manipulating the read address through the host interface.

However, because the output word width may be greater than eight bits, the data is "serialized" via the output multiplexers described above. A byte-selector cycles through each byte of the memory outputs. The L64002's particular implementation also takes further advantage of existing hardware to reduce RAM testing circuitry to a minimum.

The memory testing apparatus 22 is integrally formed on the circuit 10 with the other elements illustrated in FIGS. 1 and 2. The apparatus 22 further includes a plurality of input/output switching units 34. In the exemplary embodiment shown in the drawings, the circuit 10 includes 24 RAMs which are numbered from 16-1 to 16-24, and two ROMs 18-1 and 18-2 which are not explicitly illustrated. The RAMs 16, as well as the ROMs 18, have different sizes. Switching units 34 which are individually numbered as 34-1 to 34-24 are provided for the RAMs 16-1 to 16-24 respectively.

The switching units 34-1 to 34-24 are mapped over the top of the existing RAMs 16-1 to 16-24. The added logic and signals are shown in bold lines in FIG. 3. The timing-impact of the present test logic is about 0.7 ns of added delay on the address and data-in ports, which actually helps relieve the data-hold problems so common with on-chip RAMs. The average routing impact is 17 added inputs and 8 added outputs.

Figure 3:
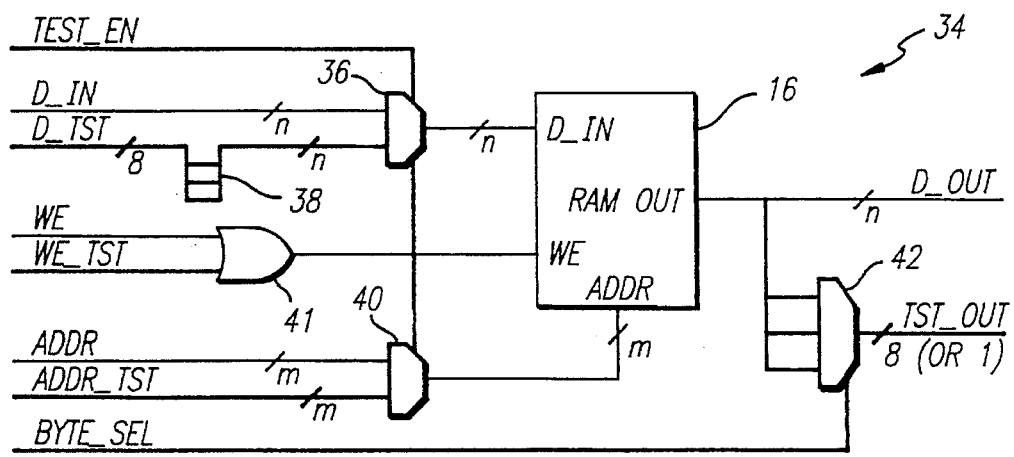
FIG. 3 is a schematic diagram illustrating a memory input/output multiplexing arrangement illustrating the memory tester.

One of the switching units 34 is illustrated in FIG. 3, illustrating how the switching units 34 serve as test templates: for the 24 RAMs 16 which are connected to the host interface 28, rendering the RAMs 16 controllable and observable to the outside world.

The illustrated RAM 16 has a data input D_IN, a write enable input WE, an address input ADDR and a data output OUT. The data input D_IN has a word width n or number of bits per data word that varies for the individual RAMs. In the L64002 MPEG chip, the smallest word is 4 bits and the largest word is 144 bits.

A two input multiplexer 36 is provided to selectively connect normal or functional data signals D_IN from the logic 20 of the integrated circuit 10, or test data signals D_TST from the control unit 30, to the data input D_IN of the RAM 16. When a test enable signal TEST_EN from the control unit 30 is high, the test signals D_TST are selected, and when the signal TEST_EN is low, the normal data signals D_IN are selected.

The test signals D_TST consist of 8-bit words. If the input word width of the RAM 16 is larger than 8 bits (n>8), the test signals D_TST are concatenated to produce the required width by circuitry 38.

In an essentially similar manner, a multiplexer 40 is provided to selectively apply normal address signals ADDR from the logic 20, or test address signals ADDR_TST from the control unit 30, to the address input ADDR of the RAM 16. The address signals can have a maximum width m which in the present example is 11 bits. For RAMs 16 having a width m of less than 11 bits, for example 4 bits, only the least significant 4 bits of the address signals are applied to the address input ADDR of the respective RAM 16.

An OR gate 41 passes either a normal write enable strobe signal WE or a test write enable strobe signal WE_TST to the write enable input of the RAM 16.

The output signals D_OUT from the RAMs 16 also have different widths n which can be larger than 8 bits. In the particular example of the invention as described and illustrated, only one 8-bit byte of a particular RAM output data signal D_OUT is output by the testing apparatus 22 at one time. This is accomplished by a multiplexer 42 which outputs one 8-bit byte of the total width of the output data D_OUT in response to a byte select signal BYTE_SEL from the control unit 30.

As illustrated in FIG. 2, the 8-bit outputs from the multiplexers 42 of all of the switching units 34 are connected to a data select multiplexer 44 of the control unit 30. In accordance with control bits stored in the storage elements 32, the multiplexer 44 and re-assembly logic 46 output 64 bits of the TST_OUT signals through an output buffer 48 as DRAM output signals DRAM_DO to the analyzer 26.

Alternatively, the output signals DRAM_DO can be applied to the host interface 28, thereby eliminating the need for the output buffer 48. In this case, the output data can be read out from the host interface 28 as indicated at D_OUT. However, the output data D_OUT bus is only 8 bits wide, and the 64-bit output data would have to be read out sequentially in the form of eight 8-bit bytes.

In accordance with the invention, the total number of bits of the output signals TST_OUT is larger than the number of bits (64) of the output signal DRAM_DO. The multiplexer 44 provides the function of serially multiplexing these signals in time.

In the exemplary form of the invention as described and illustrated, the integrated circuit 10 includes 24 RAMs 16 and 2 ROMs 18 which are to be tested by the apparatus 22. Since each switching unit 34 produces an 8-bit output, the multiplexer 44 has 26×8=208 input bits.

The output word width of the signals DRAM_DO is 64 bits. For this reason, the RAMs 16 and ROMs 18 are divided into four groups such that the total number of bits of the signals TST_OUT for each group is not greater than the output word width (64 bits). Since 208/4=52, four groups are sufficient to accommodate the 26 memories.

For normal operation of the integrated circuit 10, the test enable signal TST_EN is made low, and the multiplexers 36 and 40 of the switching units 34 apply the normal functional signals from the logic 20 to the RAMs 16. The data outputs D_OUT are applied to the logic 20. Although the outputs D_OUT are also applied to the multiplexers 42 of the switching units 34, they are not used.

For testing the RAMs 16 and ROMs 18 of the circuit 10, a control signal is applied from the test data generator 24 to the control unit 30 through the host interface 28 which causes the test enable signal TST_EN to go high. This causes the multiplexers 36 and 40 of the switching units 34 to connect the test signals D_TST, WE_TST and ADDR_TST to the RAMs 16.

Test data is applied from the test data generator 24 to the test apparatus 22 via the host interface 28. The interface 28 receives a READ signal, a WRITE signal, an 8-bit address signal ADDR and an 8-bit data signal D_IN, and applies an 8-bit data signal H_DATA, high and low 8-bit address signals H_DADDR(H) and H_DADDR(L) and a write signal H_WR to the testing apparatus 22 in response thereto. The data signal D_IN is applied to the test apparatus 22 via a buffered copy of the normal signal lines as described above.

Figure 4:
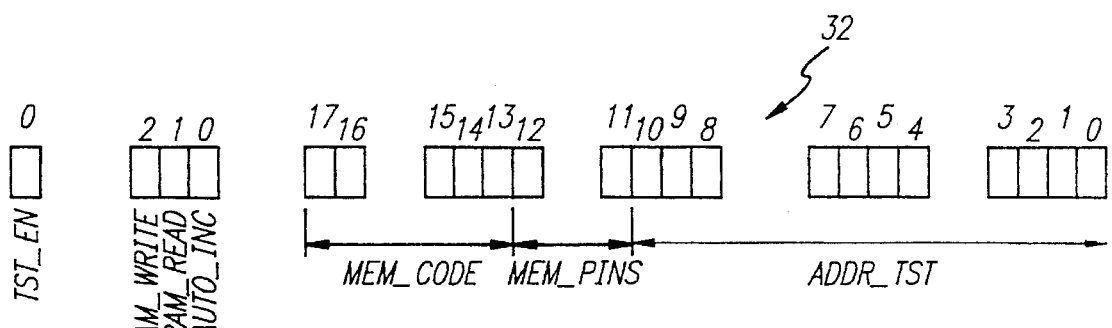
FIG. 4 is a diagram illustrating an exemplary data control arrangement of the apparatus.

By means of appropriate logic control, the testing apparatus 22 processes the signals from the interface 28 and stores in the storage elements 32 an 18-bit word including an 11-bit address test signal ADDR_TST (bits 0–10), a 2-bit group select signal MEM_PINS (bits 11–12), a memory select signal MEM_CODE (bits 13–17), four 1-bit signals. The latter include an auto-increment bit AUTO_INC, a ram read bit RAM_READ, a ram write bit RAM_WRITE and the test enable bit TST_EN. These signals are illustrated in FIG. 4.

The following TABLE I shows how the individual RAMs 16 can be individually written to or, alternatively, written to unison.

TABLE I

| RAM 16 | MEM_CODE | WE_TST ASSERTED |
|---|---|---|
|  | 0_0000 | none |
|  | 0_0001 | none |
| 16-1 | 0_0010 | rr04x136a |
| 16-2 | 0_0011 | rr04x136b |
| 16-3 | 0_0100 | rr08x136 |
| 16-4 | 0_0101 | rr12x16d |
| 16-5 | 0_0110 | rr16x11x |
| 16-6 | 0_0111 | rr16x43d |
| 16-7 | 0_1000 | rr16x64d |
| 16-8 | 0_1001 | rr16x69d |
| 16-9 | 0_1010 | rr1kx24s |
| 16-10 | 0_1011 | rr28x64d |
| 16-11 | 0_1100 | rr32x24s |
| 16-12 | 0_1101 | rr48x64d |
| 16-13 | 0_1110 | rr48x64x |
| 16-14 | 0_1111 | rr48x72x |
| 16-15 | 1_0000 | rr64x16d |
| 16-16 | 1_0001 | rr720x8s |
| 16-17 | 1_0010 | rr80x11x |
| 16-18 | 1_0011 | rr8x12s |
| 16-19 | 1_0100 | rr8x64d |
| 16-20 | 1_0101 | rr90x12 |
| 16-21 | 1_0110 | rr96x10x |
| 16-22 | 1_0111 | rr96x20t |
| 16-23 | 1_1000 | rr96x64d |
| 16-24 | 1_1001 | rr16x16d |
|  | 1_1010 | none |
|  | 1_1011 | none |
|  | 1_1100 | none |
|  | 1_1101 | none |
|  | 1_1110 | none |
|  | 1_1111 | all |

In the above TABLE I, the column labeled "WRITE ENABLE ASSERTED" lists the sizes of the 24 RAMs 16. Taking, for example, RAM 16-15, "rr" indicates "RAM", the first number (64) is the depth (number of words or addressable memory locations), whereas the second number (16) is the width (number of bits per word) of the RAM 16-15. The write enable signals WE_TST enable the test data D_TST to be written to the respective RAM 16 at the address ADDR_TST.

For writing to eh RAMs 16 individually, the MEM_CODE signal is used as a memory select signal to assert the respective write strobe input WE_TST. The second column in TABLE 1 lists the binary values of the MEM_CODE signal for each RAM 16. For example, a MEM_CODE of 0_0010 (decimal 2) selects the RAM 16-2 (rr04x136) for writing, and all other RAMs are disabled.

If the value of MEM_CODE is made 1_1111 (hexadecimal 1F or decimal 31), all of the RAMs 16 are asserted and can be written to simultaneously in parallel.

As described above, the memory address ADDR_TST is applied to all RAMs 16 and ROMs 18. Because the memories come in various sizes, not all of the memories will need all 11 bits; some many only need a few bits, 4:0 for example.

The data to be written to the selected RAM(s) comes via the 8-bit host interface input D_IN. When control bit TEST_EN is high, the data is sent directly to the respective RAM 16. For RAMs that have data inputs wider than 8 bits, the H_DATA data bits are concatenated together to form the required width.

When the control bit RAM_WRITE is made high, the selected write strobes will also be high, writing H_DATA to the selected address. If control bit AUTO_INCREMENT_

ADDRESS is also active, the ADDR_TST value will automatically increment to the next address. In this manner, the apparatus 22 can quickly write to each address of the RAM(s) 16, writing a new word each clock cycle.

For reading the RAMs 16 and ROMs 18, the WE_TST signals are made low, the MEM_CODE signal is used as the byte select signal BYTE_SEL, and one of the four groups of memories is selected using the MEM_PINS signal. The following TABLE II illustrates how the memories are divided into groups and selected using MEM_PINS. The two ROMs 18 are listed as 18-1 (640×20) and 18-2 (2K×62).

TABLE II

| TST_OUT bits | MEM_PINS 00 | MEM_PINS 01 | MEM_PINS 10 | MEM_PINS 11 |
|---|---|---|---|---|
| 7:0   | 16-3  | 16-1  | 16-2  | NA    |
| 15:8  | 16-22 | NA    | 16-22 | NA    |
| 23:16 | 16-23 | 16-15 | 16-24 | NA    |
| 31:24 | 16-20 | 16-13 | 16-11 | NA    |
| 39:32 | 18-1  | 16-12 | 16-4  | 16-18 |
| 47:40 | 16-16 | 16-17 | 16-6  | 16-19 |
| 54:48 | 16-9  | 16-14 | 16-7  | 16-5  |
| 63:55 | 18-2  | 16-21 | 16-8  | NA    |

When MEM_PINS=00, the 8-bit outputs of the memories in the second column of TABLE II are selected by the multiplexer 44 as 8 groups of 8-bit outputs of the 64 bit output signal D_OUT. When MEM_PINS=01, the outputs of the memories in the third column are selected, etc. In this manner, 208 output bits are multiplexed and output in four groups of 64 bits each.

It will be noted that six values of MEM_PINS are not used. This is because the illustrated arrangement provides for a total of 4×8=32 memories, whereas the integrated circuit 10 comprises only 26 memories.

The groups of memories are Organized to minimize the length of time required for reading output data. For example, the memories having the largest numbers of words (memory locations) are generally included in the group of MEM_PINS=00.

The MEM_CODE (BYTE_SEL) signal is used to serially output 8-bit bytes of the output signals D_OUT from the RAMs 16 and ROMs 18. For example, the RAM 16-3 has a width of 136 bits, and its output signal D_OUT is multiplexed by the multiplexer 42 as seventeen 8-bit bytes. The bytes of the output signals D_OUT are sequentially selected by incrementing the MEM_CODE value.

Figure 5:
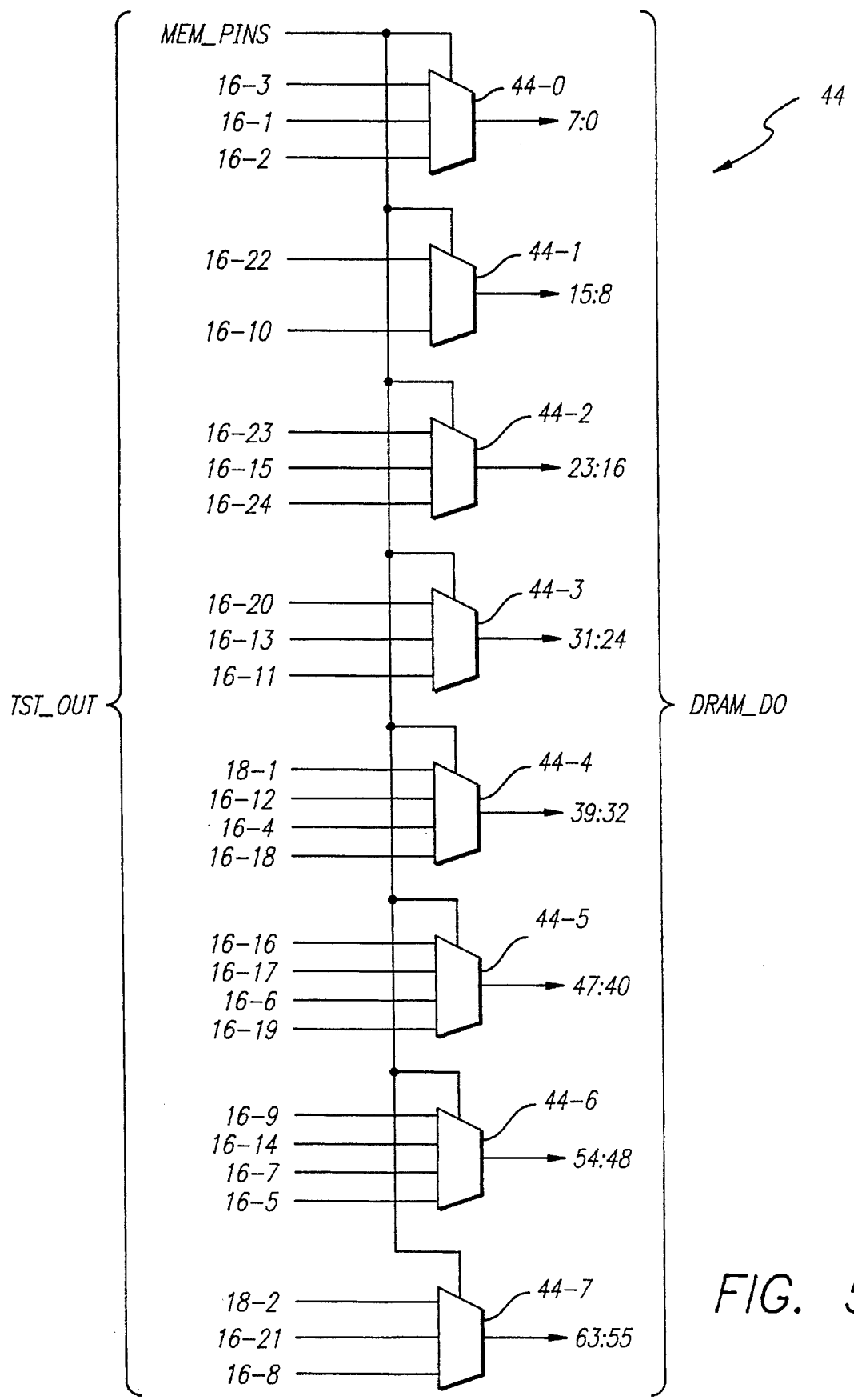
FIG. 5 is a schematic diagram illustrating an output multiplexing circuit of the apparatus.

As illustrated in FIG. 5, the multiplexer 44 comprises eight multiplexers 44-0 to 44-7 for producing the eight groups of bits of the 64 bit signal DRAM_DO in response to the 208 bit signal TST_OUT which is applied in parallel from the 26 memories. The group select signal MEM_PINS is applied to the select inputs of the multiplexers 44-0 to 44-7.

The multiplexer 44-0 is a 3-to-1 multiplexer which receives the TST_OUT signals from the RAMs 163-3, 16-1 and 16-2 and outputs them as bits 7:0 of the signal DRAM_DO when the select signal MEM_PINS has value 00, 01 and 10 respectively. The multiplexer 44-1 receives the TST_OUT signals from the RAMS 16-22 and 16-10 and outputs them as bits 15:8 of the signal DRAM_DO when the signal MEM_PINS has the value 00 and 01 respectively, etc.

Figure 6:
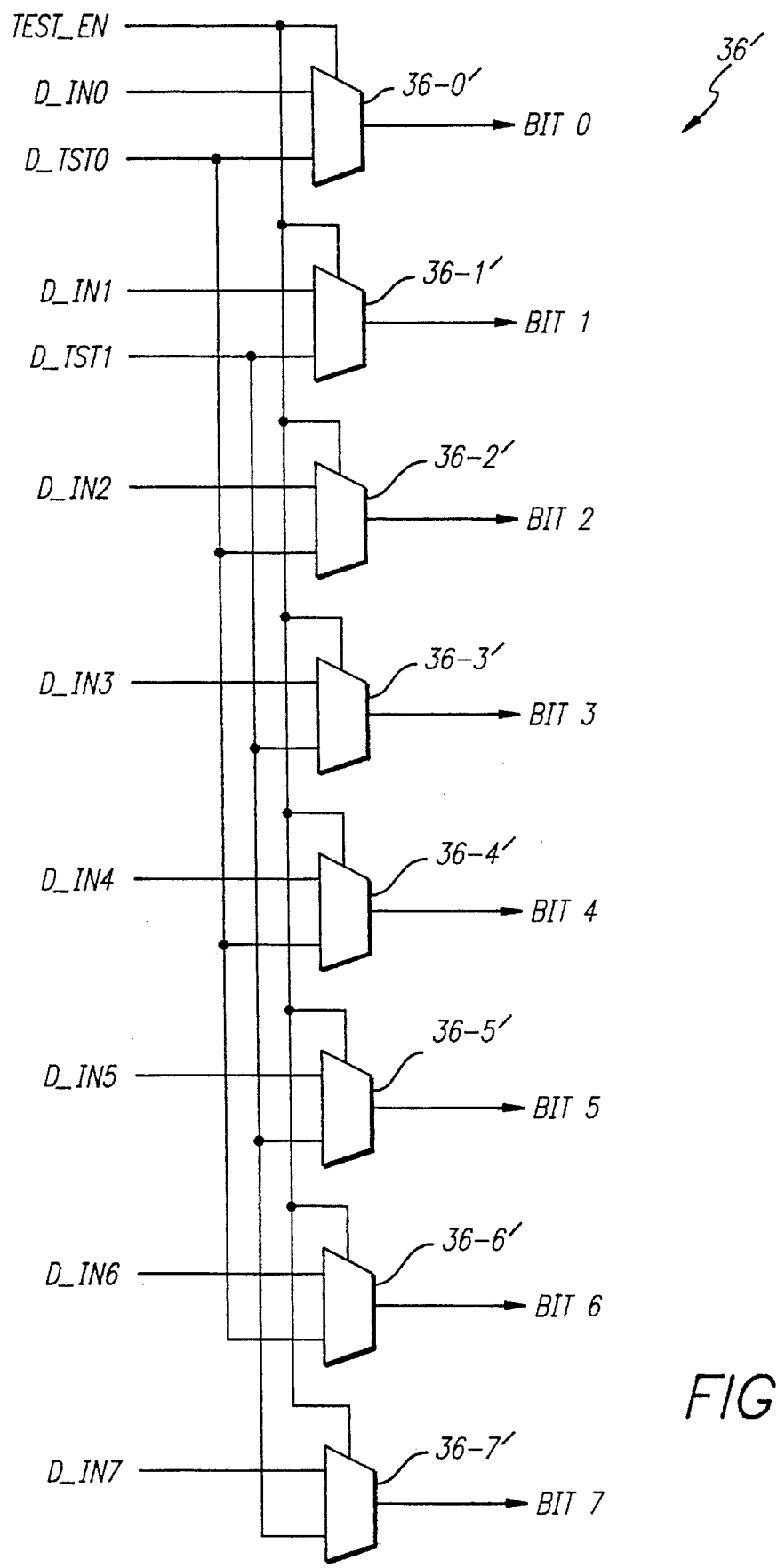
FIG. 6 is a schematic diagram illustrating an input switching and concatenating circuit of the apparatus.

FIG. 6 is a simplified diagram illustrating how the circuitry 38 replicates and concatenates the 8-bit input test signal D_TST and applies the concatenated version of this signal, which can have as many as 136 bits, to the multiplexer 36. Elements are designated by the same reference numerals used in FIG. 3 primed due to the simplification which is made for simplicity and clarity of illustration.

Whereas the circuitry 38 produces a signal of up to 136 bits from an 8-bit signal, circuitry 38' produces and applies an 8-bit signal to a multiplexer 36' in response to a 2-bit test input signal D_TST, thereby replicating the signal D_TST three times and producing a signal with four times as many bits as the signal D_TST.

The multiplexer 36' comprises eight 2-to-1 multiplexers 36-0' to 36-7'. The individual bits of the normal input signal D_IN are designated as D_IN0 to D_IN7, and are applied to inputs of the multiplexers 36-0' to 36-7' respectively. The individual bits of the signal D_TST are designated as D_TST0 and D_TST1. The bit D_TST0 is applied to inputs of the even numbered multiplexers 36', whereas the bit D_TST1 is applied to the inputs of the odd numbered multiplexers 36'.

When the test enable signal TEST_EN is low, the normal signals D_IN0 to D_IN7 are switched through to the outputs of the multiplexers 36-0' to 36-7' as bits 0 to 7 respectively. When the test enable signal TEST_EN is high, the bit D_TST0 is switched through to the outputs of the even numbered multiplexers 36-0' to 36-7', and the bit D_TST1 is switched to the outputs of the odd numbered multiplexers 36-0' to 36-7'.

Figure 7:
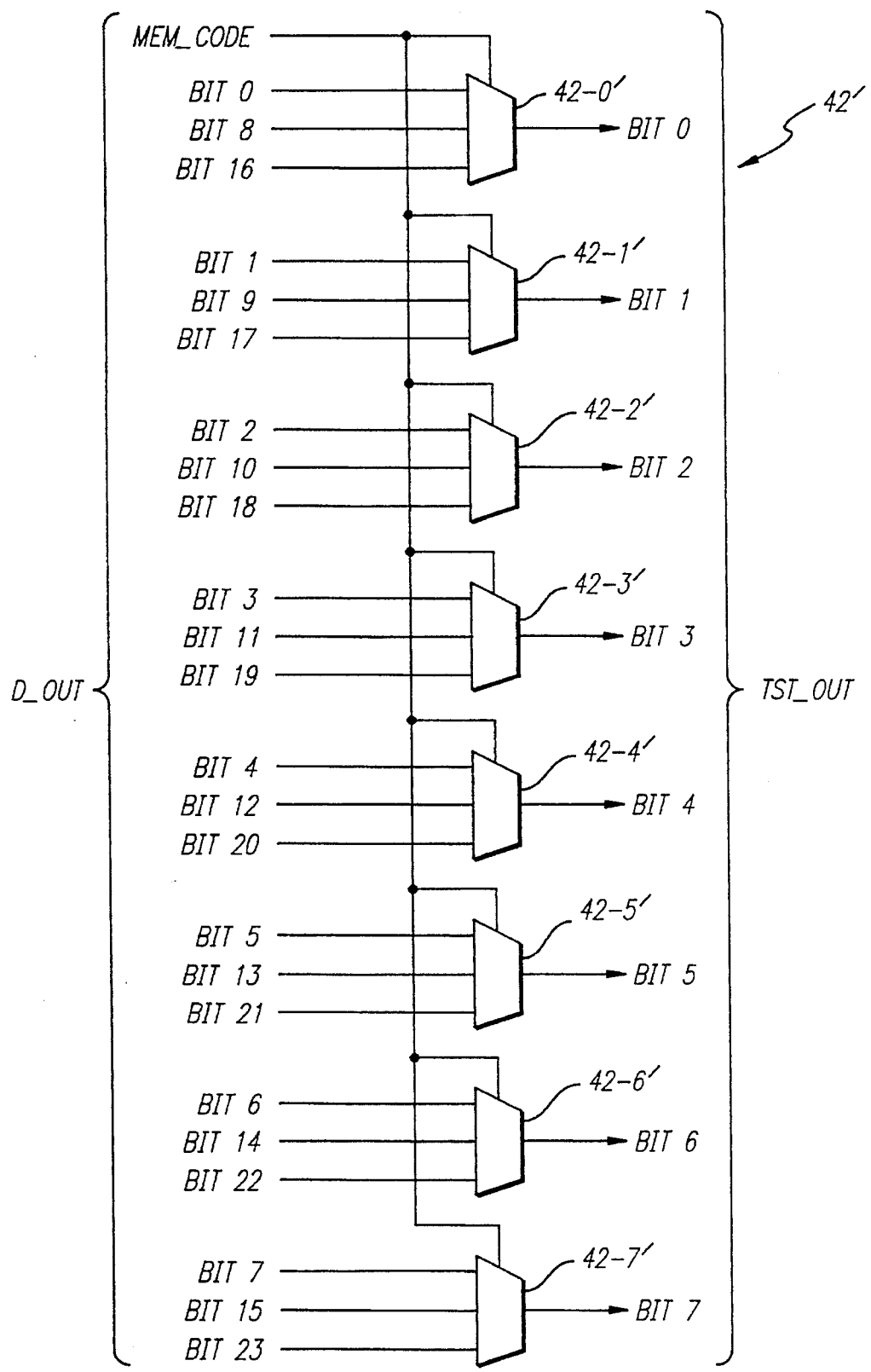
FIG. 7 is a schematic diagram illustrating an output byte selecting circuit of the apparatus.

FIG. 7 illustrates a simplified version of the multiplexer 42, which is designated as 42' and comprises eight 3-to-1 multiplexers 42-0' to 42-7'. Whereas the multiplexer 42 can have a number of input bits as large as 136 bits and produces an 8-bit output, the multiplexer 42' has a 24-bit input and produces an 8-bit output. Thus, the multiplexer 42' serially multiplexes a 24 bit input to produce a 3-byte output, with each byte consisting of 8 bits.

The bits of the 24 bit input signal D_OUT to the multiplexer 42' are numbered BIT0 to BIT23 and are applied to the inputs as illustrated. The multiplexers 42-0' to 42-7' are switched by the MEM_CODE (BYTE_SEL) signal. When this signal has the value 00, the multiplexers 42-0' to 42-7' switch bits BIT0 to BIT7 to their outputs respectively. When the signal MEM_CODE has the value 01, the multiplexers 42-0' to 42-7' switch bits BIT8 to BIT15 to their outputs respectively. When the signal MEM_CODE has the value 10, the multiplexers 42-0' to 42-7' switch bits BIT16 to BIT23 to their outputs respectively.

In the illustrated embodiment, only 8 bits can be read at one time from any particular RAM or ROM. This is an arbitrary restriction of the architecture so as to minimize routing data from the RAMs 16 and ROMs 18 to the RAM test control unit 30. Memories with words wider than 8 bits use the BYTE SEL signal to sequentially select each byte of the word as described above.

It must be noted that the present invention also includes architectures returning other bit-widths. For instance, the illustrated design can be modified so that each RAM 16 and ROM 18 only returns a single bit. The trade-offs are that 3 more BYTE_SEL bits would needed for routing to each memory, and it would take 8 times longer to read each memory. However, 8 times more memories could be read simultaneously in designs having very large numbers of memories.

Various modifications will become possible for those skilled in the art after receiving the teachings of the present disclosure without departing from the scope thereof.

I claim:

1. A testing apparatus for testing a plurality of memories including parallel outputs having a total of a first number of bits, comprising:

a parallel output bus having a second number of bits which is smaller than said first number of bits;

output means for selectively connecting outputs of the memories to the parallel output bus such that a total number of bits of said selected outputs is not greater than said second number of bits; and control means for writing test data into the memories; and for controlling the output means to read the test data out of the memories and apply the test data to the parallel output bus.

2. A testing apparatus as in claim 1, in which:

the outputs of the memories are connected to the output means in groups; and the output means is configured to selectively connect said groups of outputs to the parallel output bus in response to respective control signals from the control means.

3. A testing apparatus as in claim 2, in which the output means comprises a multiplexer having data inputs connected to the outputs of the memories, a data output connected to the parallel output bus, and a select input connected to the control means.

4. A testing apparatus as in claim 1 in which the control means writes said test data to the memories simultaneously in parallel.

5. A testing apparatus as in claim 1, in which:

one of the memories includes a parallel input having a third number of bits;

the test data has a fourth number of bits which is smaller than said third number of bits; and the control means comprises circuitry for replicating and concatenating the test data to produce concatenated test data having said third number of bits and applying said concatenated test data to the parallel input.

6. A testing apparatus as in claim 1, in which:

each memory has a parallel input;

the testing apparatus further comprises a plurality of input switch means connected to the memories respectively, each switch means having a parallel output connected to the parallel input of the memory, a parallel logic input for receiving logic data and a parallel test input for receiving the test data; and the control means comprises multiplexing means for selectively controlling each input switch means to connect the logic input or the test input to the output thereof.

7. A testing apparatus as in claim 1, in which:

one of the memories includes a parallel output having a third number of bits;

the testing apparatus further comprises output switch means having a parallel input connected to the parallel output of said one of the memories, and a parallel output having a fourth number of bits which is less than said third number of bits which is connected to the output means;

the output switch means comprises means for selectively connecting groups of outputs of said one of the memories to the output means such that each group has said third number of bits; and the control means comprises multiplexing means for controlling the output switch means to sequentially connect said groups of outputs to the output means.

8. A testing apparatus as in claim 7, in which each group of outputs corresponds to a byte of said test data.

9. A testing apparatus as in claim 8, in which the output switch means comprises a multiplexer.

10. A microelectronic circuit, comprising:

a plurality of memories including parallel outputs having a total of a first number of bits, comprising:

a parallel output bus having a second number of bits which is smaller than said first number of bits;

output means for selectively connecting outputs of the memories to the parallel output bus such that a total number of bits of said selected outputs is not greater than said second number of bits;

input means for inputting test data; and control means for writing test data into the memories; and for controlling the output means to read the test data out of the memories and apply the test data to the parallel output bus.

11. A microelectronic circuit as in claim 10, in which:

the outputs of the memories are connected to the output means in groups; and the output means is configured to selectively connect said groups of outputs to the parallel output bus in response to respective control signals from the control means.

12. A microelectronic circuit as in claim 11, in which the output means comprises a multiplexer having data inputs connected to the outputs of the memories, a data output connected to the parallel output bus and a select input connected to the control means.

13. A microelectronic circuit as in claim 10, in which the control means writes said test data to the memories simultaneously in parallel.

14. A microelectronic circuit as in claim 10, in which:

one of the memories includes a parallel input having a third number of bits;

the test data has a fourth number of bits which is smaller than said third number of bits; and the control means comprises circuitry for replicating and concatenating the test data to produce concatenated test data having said third number of bits and applying said concatenated test data to the parallel input.

15. A microelectronic circuit as in claim 10, further comprising logic circuitry, in which:

each memory has a parallel input;

the microelectronic circuit further comprises a plurality of input switch means connected to the memories respectively, each switch means having a parallel output connected to the parallel input of the memory, a parallel logic input for receiving logic data from the logic circuitry and a parallel test input for receiving the test data; and the control means comprises multiplexing means for selectively controlling each input switch means to connect the logic input or the test input to the output thereof.

16. A microelectronic circuit as in claim 10, in which:

one of the memories includes a parallel output having a third number of bits;

the microelectronic circuit further comprises output switch means having a parallel input connected to the parallel output of said one of the memories, and a parallel output having a fourth number of bits which is less than said third number of bits which is connected to the output means;

the output switch means comprises means for selectively connecting groups of outputs of said one of the memories to the output means such that each group has said third number of bits; and the control means comprises multiplexing means for controlling the output switch means to sequentially connect said groups of outputs to the output means.

17. A microelectronic circuit as in claim 16, in which each group of outputs corresponds to a byte of said test data.

18. A testing apparatus as in claim 17, in which the output switch means comprises a multiplexer.

\* \* \* \* \*